United States Patent
Asano et al.

(10) Patent No.: US 11,189,353 B2
(45) Date of Patent: *Nov. 30, 2021

(54) MEMORY SYSTEM AND MEMORY CONTROL METHOD

(71) Applicant: TOSHIBA MEMORY CORPORATION, Tokyo (JP)

(72) Inventors: Shigehiro Asano, Yokosuka Kanagawa (JP); Neil Buxton, Caversham (GB); Julien Margetts, Thame (GB); Shunichi Igahara, Kamakura Kanagawa (JP); Takehiko Amaki, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/060,767

(22) Filed: Oct. 1, 2020

(65) Prior Publication Data

US 2021/0020253 A1 Jan. 21, 2021

Related U.S. Application Data

(63) Continuation of application No. 16/159,410, filed on Oct. 12, 2018, now Pat. No. 10,854,302.

(30) Foreign Application Priority Data

Mar. 19, 2018 (JP) .............................. JP2018-051605

(51) Int. Cl.
*G11C 11/34* (2006.01)
*G11C 16/34* (2006.01)
(Continued)

(52) U.S. Cl.
CPC ............ *G11C 16/3431* (2013.01); *G11C 8/12* (2013.01); *G11C 16/26* (2013.01); *G11C 16/3495* (2013.01); *G11C 16/0483* (2013.01)

(58) Field of Classification Search
CPC ............ G11C 16/26; G11C 16/34; G11C 8/12
(Continued)

(56) References Cited

U.S. PATENT DOCUMENTS 7,818,525 B1 10/2010 Frost et al.
9,257,169 B2 2/2016 Jung et al.
(Continued)

FOREIGN PATENT DOCUMENTS

JP 2009205578 A 9/2009
JP 2009223876 A 10/2009
(Continued)

OTHER PUBLICATIONS

Japanese Office Action dated Aug. 3, 2021, mailed in counterpart Japanese Application No. 2018-051605, 10 pages (with translation).

*Primary Examiner* — Amir Zarabian
*Assistant Examiner* — Minh Dinh
(74) *Attorney, Agent, or Firm* — Kim & Stewart LLP

(57) ABSTRACT

A memory system comprises a nonvolatile memory having a plurality of memory cells and a memory controller for controlling the nonvolatile memory. The plurality of memory cells is divided into different groups, and each group is assigned a threshold read count value from a predetermined range of read count values. The memory controller includes a counter which tracks a read count for each group, a determination circuit configured to compare the read count for each group tracked by the counter to the assigned threshold read count value for the group, and a nonvolatile memory read/write circuit configured to read data from the group when the determination circuit indicates
(Continued)

the read count for the group has reached the assigned threshold read count value.

18 Claims, 10 Drawing Sheets

(51) Int. Cl.
  *G11C 8/12* (2006.01)
  *G11C 16/26* (2006.01)
  *G11C 16/04* (2006.01)
(58) Field of Classification Search
  USPC ...................................................... 365/185.2
  See application file for complete search history.

(56) References Cited

U.S. PATENT DOCUMENTS

| | | |
|---|---|---|
| 9,430,154 B2 | 8/2016 | Cohen |
| 9,653,176 B2 | 5/2017 | Cai et al. |
| 10,854,302 B2 * | 12/2020 | Asano .................... G11C 8/12 |
| 2009/0172267 A1 | 7/2009 | Oribe et al. |
| 2010/0313084 A1 | 12/2010 | Hida et al. |
| 2014/0173180 A1 * | 6/2014 | D'Abreu ............ G11C 16/3431 |
| | | 711/103 |
| 2014/0223246 A1 | 8/2014 | Kim et al. |
| 2015/0380085 A1 | 12/2015 | Park et al. |
| 2016/0070643 A1 * | 3/2016 | Shen .................... G11C 16/349 |
| | | 711/103 |
| 2016/0118132 A1 | 4/2016 | Prins et al. |
| 2016/0225461 A1 | 8/2016 | Tuers et al. |
| 2018/0061483 A1 | 3/2018 | Morgan |

FOREIGN PATENT DOCUMENTS

| | | |
|---|---|---|
| JP | 2009224012 A | 10/2009 |
| JP | 2009224013 A | 10/2009 |
| JP | 2017055870 A | 3/2017 |
| JP | 6108949 B2 | 4/2017 |
| JP | 5483378 B1 | 5/2017 |
| JP | 6163540 B2 | 7/2017 |
| WO | 2009107268 A1 | 9/2009 |

* cited by examiner

FIG. 4

| COUNTING GROUP | DOWN COUNTER |
|---|---|
| ××××1 | 93000 |
| ××××2 | 98000 |
| ××××3 | 92000 |
| ××××4 | 96000 |
| ××××5 | 91000 |
| ⋮ | ⋮ |

US 11,189,353 B2

MEMORY SYSTEM AND MEMORY CONTROL METHOD

CROSS-REFERENCE TO RELATED APPLICATIONS

This application is a continuation of U.S. patent application Ser. No. 16/159,410, filed on Oct. 12, 2018, which is based upon and claims the benefit of priority from. Japanese Patent Application No. 2018-051605, filed Mar. 19, 2018, the entire contents of which are incorporated herein by reference.

FIELD

Embodiments described herein relate generally to a memory system and a memory control method.

BACKGROUND

In the related art, a memory system includes a nonvolatile memory and a memory controller which controls the nonvolatile memory. The nonvolatile memory comprises a plurality of memory cells, which may be NAND flash memory cells or the like. A NAND flash type memory may also be referred to more simply as "NAND memory".

DESCRIPTION OF THE DRAWINGS

FIG. 4 is a diagram illustrating an example of an initial counter value in a first embodiment.

DETAILED DESCRIPTION

Figure 1:
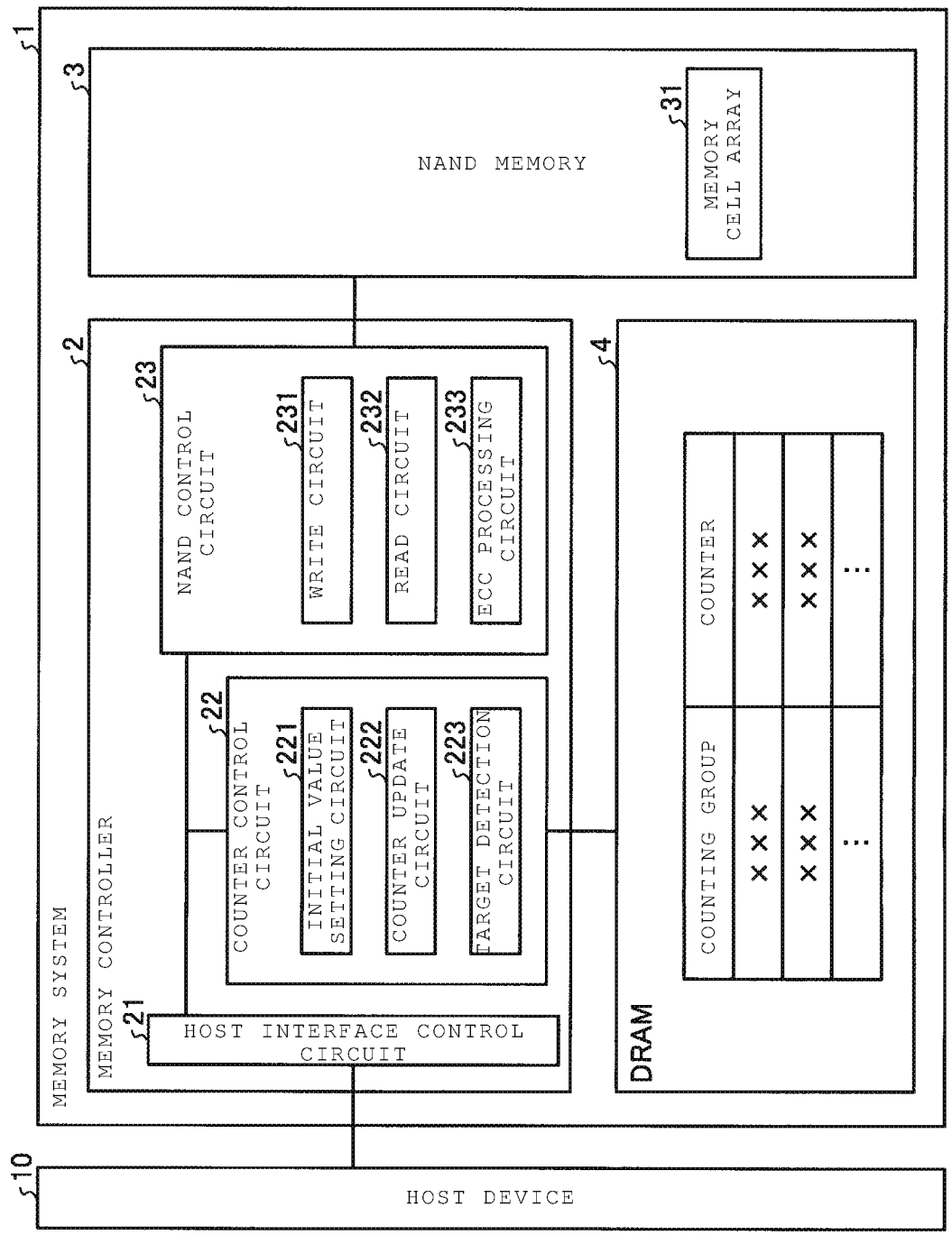
FIG. 1 is a diagram illustrating a configuration of a memory system of a first embodiment.

In the nonvolatile memory, a phenomenon referred to as "read disturb" might occur, which reduces the reliability of data stored in the nonvolatile memory.

The present disclosure describes memory systems and memory control methods which can prevent the reliability reduction caused by the read disturb.

In general, according to one embodiment, a memory system comprises a nonvolatile memory including a plurality of memory cells and a memory controller for controlling the nonvolatile memory. The plurality of memory cells is divided into a plurality of groups, and each group is assigned a threshold read count value from a predetermined range of read count values. The memory controller includes a counter which is configured to track a read count for each group, a determination circuit configured to compare the read count for each group tracked by the counter to the assigned threshold read count value for the group, and a nonvolatile memory read/write circuit configured to read data from the group when the determination circuit indicates the read count for the group has reached the assigned threshold read count value.

Hereinafter, a memory system and a memory control method according to an example embodiment will be described with reference to the accompanying drawings. However, the present disclosure is not limited to the example embodiments. In the descriptions of some embodiments, the aspects similar to a previously described embodiment may be omitted from the description of subsequent embodiments.

A comparative example from related art will be first described in order to help with understanding of embodiments of the present disclosure. In the comparative example, as a countermeasure to the read disturb phenomenon in a nonvolatile memory, a counter is provided to track a read count for every memory region. When the read count value in the counter reaches a threshold value, the data of the corresponding memory region is refreshed. In this context, "refreshing" is a process in which the data is read from a memory region then written (rewritten) back to the memory region or another memory region. In general, refreshing is utilized to compensate for possible degradation (e.g., introduction of bit errors or the like) of the previously stored data. Refreshing may be performed based on a predetermined reference metric (for example, the number of errors in the stored data as read), and when it is determined that the reliability of the data has been degraded, the corrected data is rewritten to a memory region, which may be the same or different region from that from which the data was read.

However, in the method, the counter values for a plurality of memory regions might reach the threshold value at nearly the same time, such as when, for example, a sequential read is performed. Then, the refresh process would be performed repeatedly, and thus an interrupt event might fail to be received by a receiver, or the performance of the storage device might be deteriorated. The present disclosure provides a method for avoiding such problems as found in the comparative example. Here, a "sequential read" refers to read-accessing addresses sequentially in an address space, and also to repeatedly read-accessing addresses sequentially within a certain address range. In addition, the address space related to the sequential read usually corresponds to a logical address space. However, in some examples, the address space may correspond to a physical address space instead.

First Embodiment

Hereinafter, a first embodiment will be described. FIG. 1 is a diagram illustrating a configuration of a memory system 1 of the first embodiment. The memory system 1 illustrated in FIG. 1 includes a memory controller 2, a NAND memory 3, and a dynamic random access memory (DRAM) 4 as components, and operates based on a command received from a host device 10.

The NAND memory 3 is a nonvolatile memory which includes a plurality of memory cells to store data. In the NAND memory 3, the plurality of memory cells is arranged in a matrix configuration that includes rows and columns.

The plurality of memory cells arranged in the matrix configuration is called a memory cell array 31.

Figure 2:
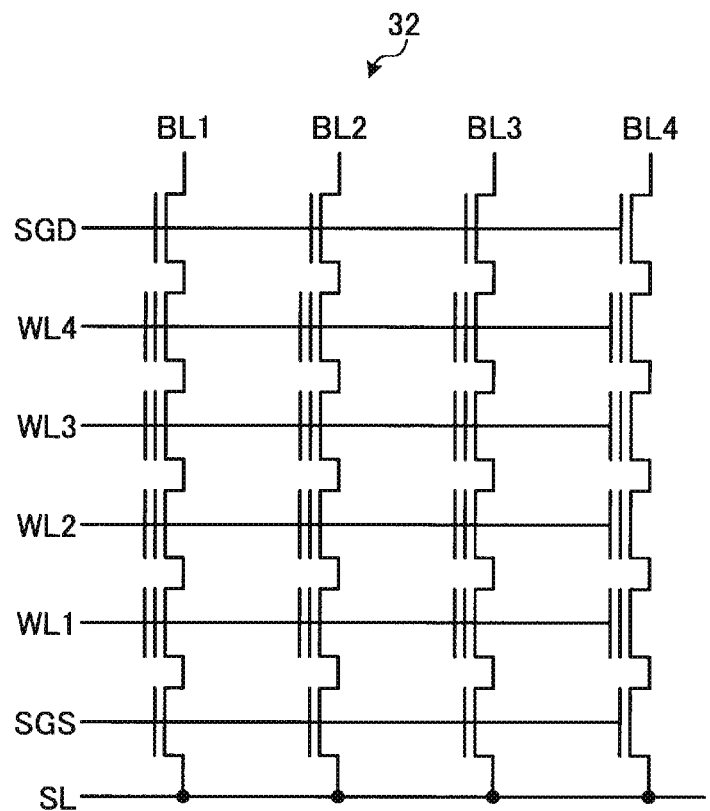
FIG. 2 is a diagram schematically illustrating a structure of a block in a memory cell array of a NAND memory of a first embodiment.

FIG. 2 is a diagram schematically illustrating a structure of a block 32 in the memory cell array 31. As illustrated in FIG. 2, the memory cell array 31 is formed of a plurality of NAND strings in which a plurality of memory cells (e.g., transistors) is connected in series. Each NAND string in a block is connected to one bit line (BL). In each block, one NAND string corresponds to one bit line. Each bit line is connected to NAND strings in several blocks. Gate electrodes of the memory cells at corresponding positions across the plurality of NAND strings are connected to each other by a word line (WL).

In FIG. 2, a source line SL, a select gate line SGS, word lines WL1 to WL4, and a select gate line SGD each extend in a horizontal direction (i.e., left-right page direction) and are arranged in order along the vertical direction (i.e., top-bottom page direction) from the source line SL upwards. In addition, bit lines BL1 to BL4 each extend in the vertical direction and are arranged in order along the horizontal direction from left to right. Further, in FIG. 2, only four bit-lines BL1 to BL4 are illustrated, and only the word lines WL1 to WL4 are illustrated. However, more bit lines and word lines are typically provided. In the NAND memory 3, information of 1 to 4 bits can be stored in each memory cell.

Writing of data is performed by setting a threshold voltage of each memory cell of a memory cell group to a voltage level corresponding to each piece of data. In other words, the data is stored based on a threshold voltage of each memory cell of the memory cell group. When the data is read, a target read voltage is applied to the word line corresponding to the addressed memory cell group to which the data has been written, and the other word lines are set to high voltage (i.e., read passing voltage). In the reading it is determined whether the threshold voltage of each memory cell of the memory cell group storing the target data is higher or lower than the applied target read voltage. By repeatedly performing this process with different voltage levels, the states (i.e., threshold voltages) of all the memory cells on the word line are detected and the data stored on the word line is read.

In the NAND memory 3, when the data is repeatedly read from the same memory cell, a bit error may occur in a memory cell near the targeted read memory cell. This error type is the read disturb.

Figure 3:
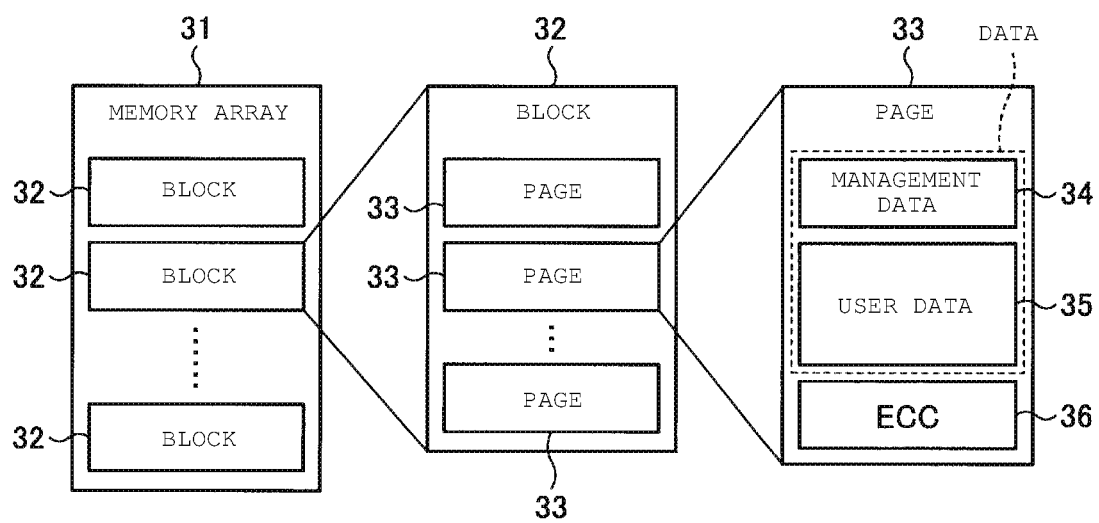
FIG. 3 is a diagram illustrating a data storage structure in the memory cell array of a first embodiment.

FIG. 3 is a diagram illustrating a data storage structure in the memory cell array 31 of the first embodiment. The memory cell array 31 of the NAND memory 3 includes a plurality of blocks 32, typically. Further, the blocks 32 each include a plurality of pages 33. The writing to the NAND memory 3 is performed in units of pages. In general, one page 33 is written with data and an error correction code (ECC) 36. The data in this context may include user data 35, which is also referred to as write data 35, and management data 34.

As illustrated in FIG. 1, a write command and a read command from the host device 10 to the memory system 1 are sent to the memory controller 2. The memory controller 2 controls the NAND memory 3 based on a command from the host device 10 to write data to the NAND memory 3 or to read data from the NAND memory 3. The NAND memory 3 and the memory controller 2 correspond to each other in a one-to-one manner in FIG. 1. However, one memory controller 2 may control several NAND memories 3.

The memory controller 2 includes a host interface control circuit 21, a counter control circuit 22, and a NAND control circuit 23. The memory controller 2 is, for example, a semiconductor integrated circuit formed as a system-on-a-chip (SoC), and includes a central processing unit (CPU), a random access memory (RAM), and a read only memory (ROM).

The host interface control circuit 21 transfers data based on a command issued by the host device 10. Specifically, the host interface control circuit 21 converts an address designated by the host device 10, which is a logical address, for example a logical block address (LBA), into the physical address of the NAND memory 3. An address conversion table may be used in converting logical addresses to physical addresses.

The NAND control circuit 23 controls the NAND memory 3 based on a signal sent from the host interface control circuit 21. Specifically, the NAND control circuit 23 sends a command and an address to the NAND memory 3 to write or read data.

The NAND control circuit 23 includes a write circuit 231, a read circuit 232, and an ECC processing circuit 233.

The write circuit 231 sends a command and address information to the NAND memory 3 so as to write data to the NAND memory 3. Data sent from the host device 10 as write data includes an ECC added by the ECC processing circuit 233, and is converted into the data to be written to the NAND memory 3. Further, the data added with the ECC may be randomized. In addition, when the user data 35 is written to the NAND memory 3, the address conversion table is updated so that the logical address of the user data 35 corresponds to the physical address to which the user data 35 is written in the NAND memory 3.

The read circuit 232 sends a command and address information to the NAND memory 3 to read data from the NAND memory 3. At this time, in a case where the reading from the NAND memory 3 is based on a read command received from the host device 10, a logical address included in the read command is converted into a corresponding physical address by reference to the address conversion table. The data read from the NAND memory 3 is subjected to the error correction by the ECC processing circuit 233 (in a case where the randomization has been performed at the time of writing, a reverse conversion of the randomization is also performed).

In the plurality of memory cells in the NAND memory 3, a counting group for tracking the read count is predetermined. For example, the counting group is set in units of blocks or in units of pages. In addition, the counting group is specified by physical address, for example. However, the counting group may instead be specified by logical address. The DRAM 4 stores counter values obtained by tracking the read count for each counting group. When power is turned off, information stored in the DRAM 4 is lost. Thus, the information including the counter values in DRAM 4 is stored in a nonvolatile memory before the power is turned off, and the respective counter values can be loaded to the DRAM 4 when the power is turned back on.

Figure 7:
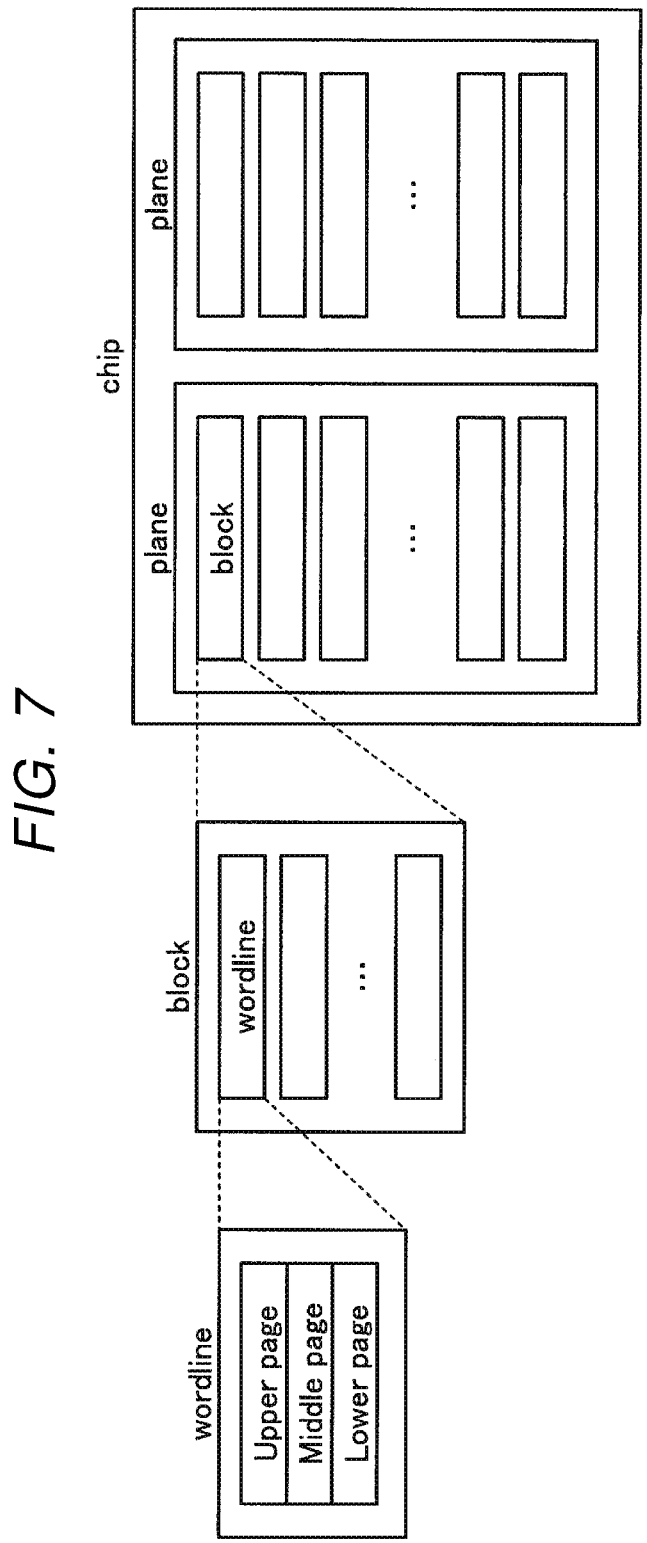
FIG. 7 is a diagram schematically illustrating a structure of the memory cell array of a first embodiment.

Herein, a method of defining the counting group will be described. First, structures of the memory cell array 31 and the NAND memory 3 will be described with reference to FIGS. 7 to 9. FIG. 7 is a diagram schematically illustrating a structure of the memory cell array 31. Each chip includes a plurality of planes. Each plane includes a plurality of blocks. Each block includes a plurality of word lines. Each word line provides a plurality of pages (in FIG. 7 the pages Upper page, Middle page, and Lower page are depicted as examples). A page, a word line, and a block may be called a physical page, a physical word line, and a physical block, respectively, in the following description.

Figure 8:
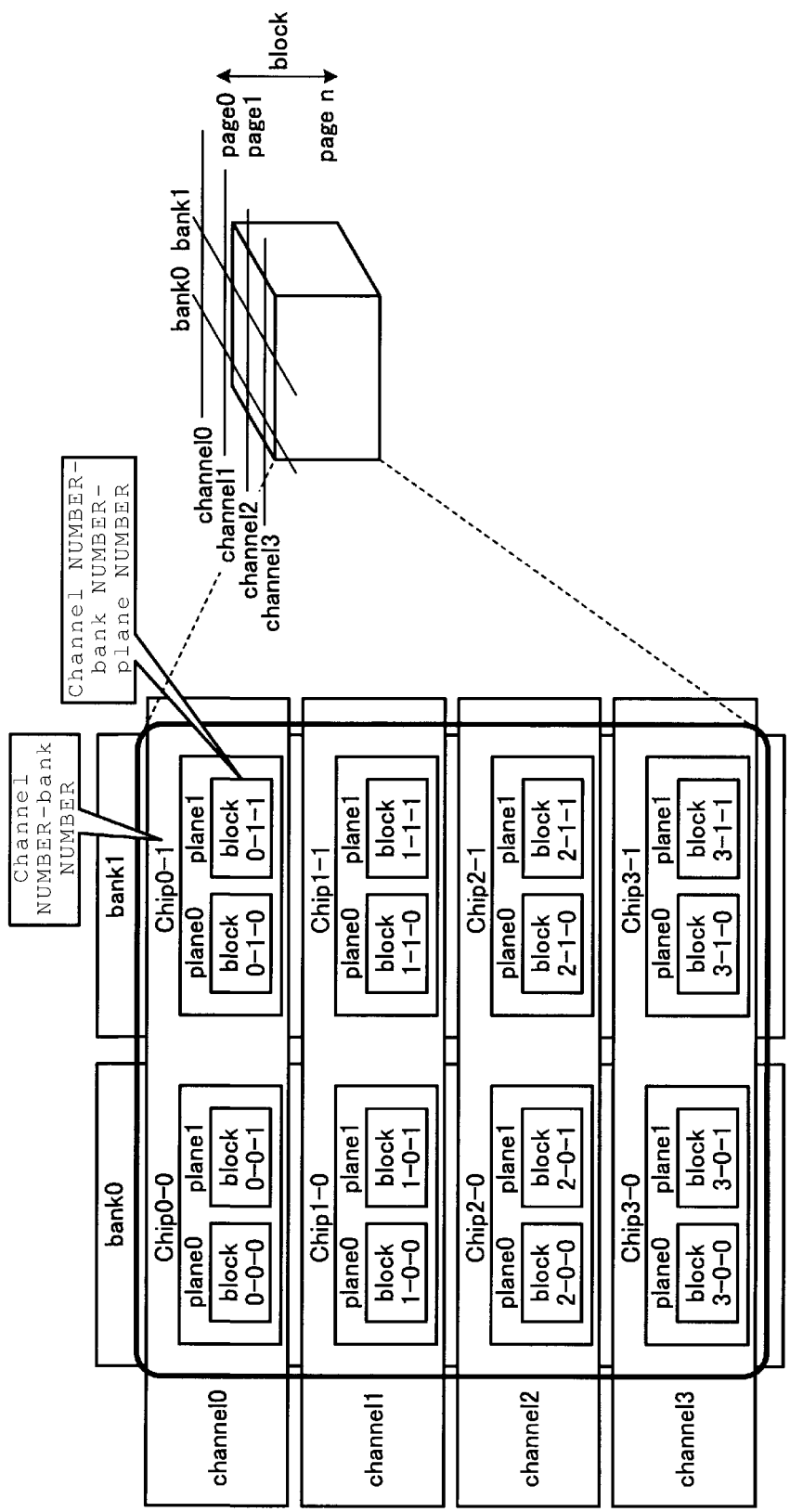
FIG. 8 is a diagram schematically illustrating a structure of the NAND memory of a first embodiment.

FIG. 8 is a diagram schematically illustrating a structure of the NAND memory 3. As illustrated in FIG. 8, each chip may be specifically designated by a combination of its channel number (the channel to which the chip is connected) and its bank number (the bank in which the chip is disposed). In addition, each block may be specifically designated by a combination of its channel number, bank number, and plane number.

Herein, by selecting at least one physical block from each plane of each chip, a logical block is formed by combining the selected physical blocks of one or more chips that correspond to one or more banks of each channel. The logical block is a unit of management of blocks in the memory system 1. State transitions and erase operations may be managed in units of logical blocks.

In addition, a group of physical blocks in the plurality of planes in one chip is called a physical block group within one logical block.

Figure 9:
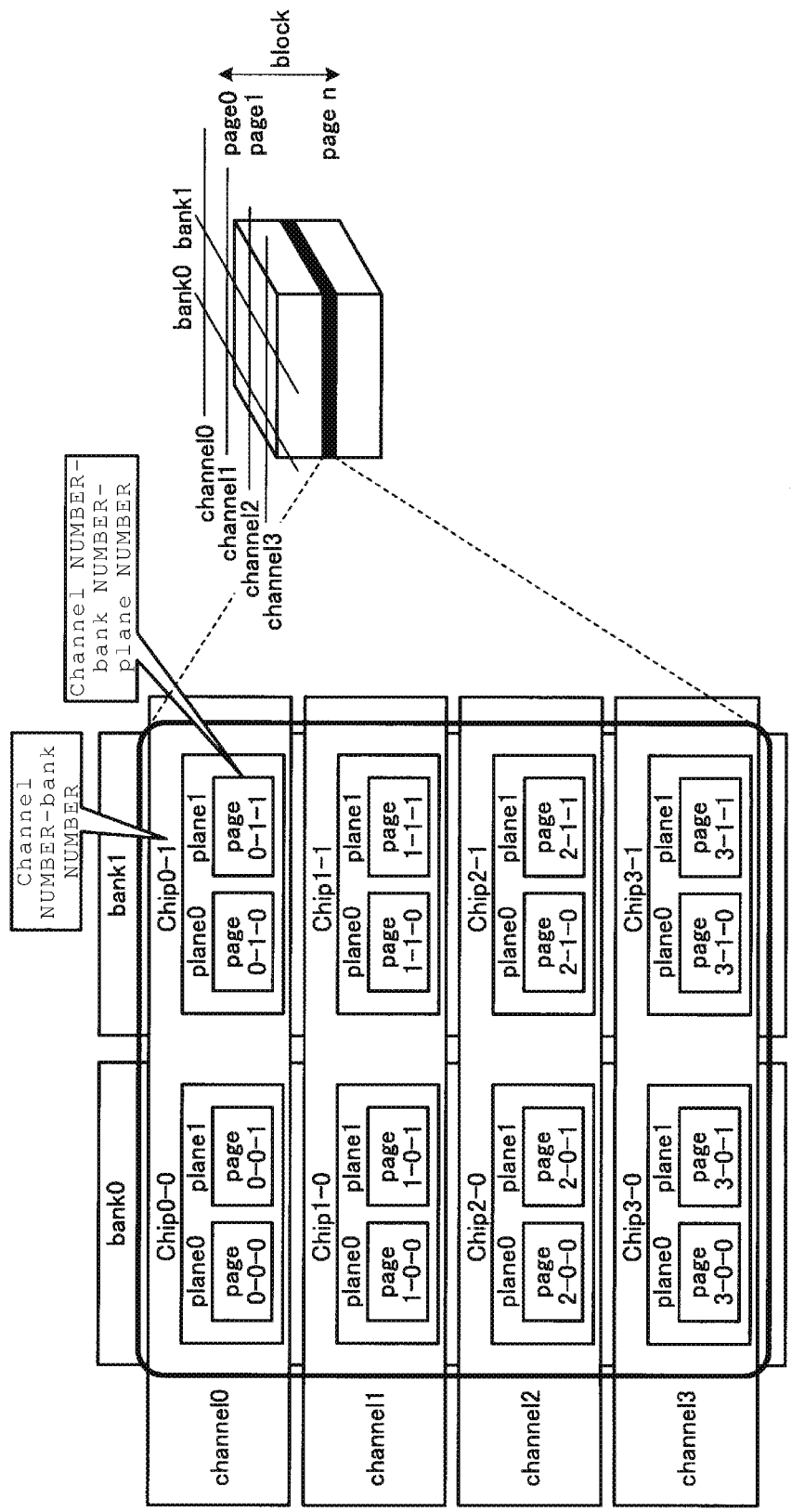
FIG. 9 is a diagram schematically illustrating a structure of the NAND memory of a first embodiment.

FIG. 9 is a diagram schematically illustrating a structure of the NAND memory 3. A set of one physical page of the respective physical blocks that form a logical block is called a logical page. Similarly, a set of one word line of the respective physical blocks that form the logical block is called a logical word line.

The counting group may be defined in units of physical pages, physical word lines, and physical blocks.

Otherwise, the counting group may be defined in a unit of a physical page set, a physical word line set, and a physical block set in which physical pages, physical word lines, and physical blocks each are grouped in a plane direction in the logical block (that is, formed across multiple planes). Further, the number of groupings need not be necessarily equal.

In addition, the counting group may be defined in a unit of a physical page group, and a physical word line group in which the plurality of adjacent elements (e.g., pages or word lines) is grouped (in directions of the page and the word line) in the physical block. Further, the number of groupings need not be equal.

In addition, the counting group may be defined in a unit of a physical page set group and a physical word line set group in which physical page groups and physical word line groups are formed across multiple planes.

In addition, the counting group may be defined in units of logical blocks.

As illustrated in to FIG. 1, the counter control circuit 22 includes an initial value setting circuit 221, a counter update circuit 222, and a target detection circuit 223. In this example, different counting groups can each be assigned a different threshold number selected from a predetermined threshold range for the threshold value of each read count, in order to avoid a situation in which many counter values closely reach the threshold value. For example, if a value of 100,000 is to be considered as the threshold number, the predetermined threshold range might be between 90,000 and 100,000.

In the following, a down counter indicates a counter which counts the read count by decreasing the counter value one by one. In addition, an up counter indicates a counter which counts the read count by increasing the counter value one by one. Further, determination as to whether the read count reaches the threshold value can be realized by combining an initial counter value and a counter target value.

For example, any number between 90,000 and 100,000 can be set as an initial down counter value for a counting group. In addition, a down counter target value is set to zero, and the down counter corresponding to the counting group may be decremented whenever read operation is performed on the counting group.

Figure 12:
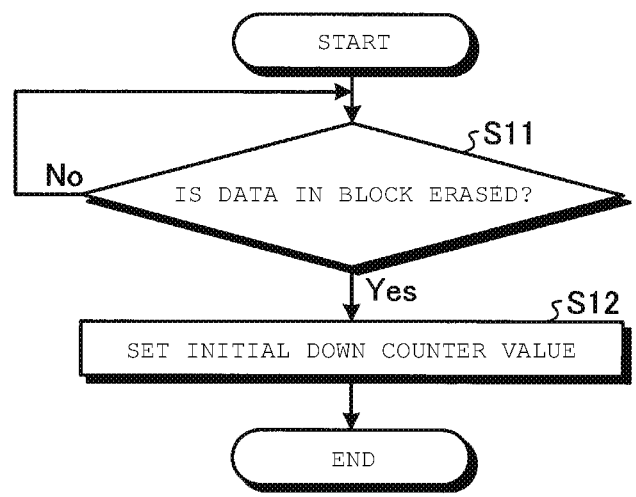
FIG. 12 is a flowchart illustrating a process of setting an initial counter value in the memory system of the first embodiment.

FIG. 12 is a flowchart illustrating a process of setting an initial counter value in the memory system 1 of the first embodiment. The initial value setting circuit 221 determines whether data in a block in a counting group has been erased (Step S11). In a case where it is determined 'Yes', the procedure proceeds to Step S12. In a case where it is determined 'No', the procedure returns to Step S11.

In Step S12, the initial value setting circuit 221 randomly selects any number within a predetermined initial value range for each counting group and this selected number is set as an initial down counter value.

In this way, the initialization of a down counter (e.g., setting of an initial value) may be performed, for example, when data in a block of a counting group corresponding to the down counter is erased. FIG. 4 is a diagram illustrating an example of the initial down counter value in the first embodiment. As illustrated in FIG. 4, any number between 90,000 and 100,000 can be set as the initial down counter value for each counting group. The initial down counter values of all the counting groups may be set differently, but this is not necessarily required as described in detail later.

In a case where the down counter is decremented, setting the down counter target value in common for a plurality of down counters while the initial down counter values is set differently for each down counter, and setting the initial down counter values in common for a plurality of down counters while the down counter target values are set differently for each down counter are actually equivalent in operation. In the first embodiment, the former is employed instead of the latter, but the latter may be employed as well.

As illustrated in FIG. 1, the initial value setting circuit 221 randomly selects any number in a predetermined initial value range (for example, between 90,000 and 100,000) for each counting group (for example, by selecting in a random manner), and sets the selected value as the initial down counter value.

In addition, the counter update circuit 222 updates the read count for each counting group by decrementing the down counter in the DRAM 4 at every reading. Further, the counter update circuit 222 keeps the down counter value as the down counter target value when read operation is further performed on the counting group in which the down counter value reaches the down counter target value. For example, in a case where the down counter target value is zero, the down counter value is kept to zero.

In addition, the target detection circuit 223 determines whether the down counter value in the DRAM 4 has reached zero for each counting group.

In addition, in a case where the target detection circuit 223 determines that there is a counting group in which the counter value has reached the target value, for example, in a case where the target detection circuit 223 determines that there is a counting group in which the down counter value reaches zero, the NAND control circuit 23 reads data corresponding to the counting group. Then, the NAND control circuit 23 determines whether there is a need for refreshing using the ECC processing circuit 233. Note that the determination process for the ECC processing circuit 233 may be omitted in some examples.

When the number of errors in the data is larger than some predetermined value, refreshing may be performed. The refreshing is a process in which, after the ECC processing circuit 233 determines that the data has degraded in reliability, the read circuit 232 reads the data, the ECC processing circuit 233 corrects errors in the data, and the write circuit 231 re-writes the corrected data to a plurality of memory cells. The place to which the corrected data is written in the refreshing may be another memory cell or may be the same memory cell.

Figure 10:
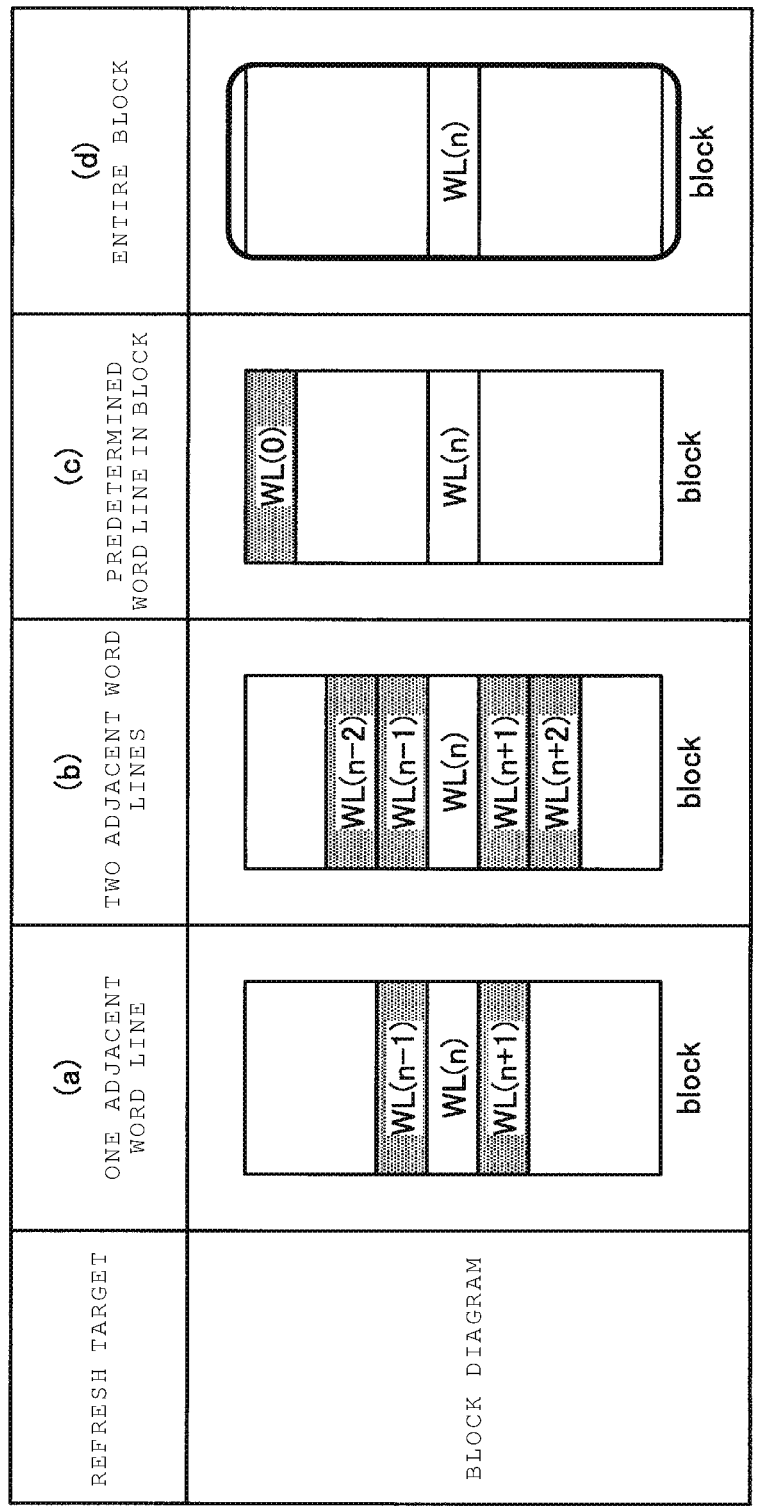
FIG. 10 is a diagram for describing a range of a refresh target in a first embodiment.

In general, a location from which the data is to be read, as described above, may be within a range of memory cells physically near the counting group of which the corresponding down counter value reaches zero. Herein, a range of a refresh target (that is, the memory cell range to be refreshed) will be described with reference to FIGS. 10 and 11. FIG. 10 is a diagram for describing a range of the refresh target.

In FIG. 10, the counting group is configured in a unit of word line, and the counting group for which the down counter value reaches the down counter target value is WL(n). In this case, as illustrated in column (a) of FIG. 10, the refresh target may be the word lines (WL(n−1) and WL(n+1)) adjacent to either side of the word line WL(n).

In addition, as illustrated in column (b) of FIG. 10, the refresh target may be the two word lines (e.g., WL(n−2), WL(n−1), WL(n+1), and WL(n+2)) on either side of the word line WL(n).

In addition, as illustrated in column (c) of FIG. 10, the refresh target may be a word line in the block which is particularly vulnerable to the read disturb, for example, word line WL(0).

In addition, as illustrated in column (d) of FIG. 10, the refresh target may be the entire block which contains WL(n).

Figure 11:
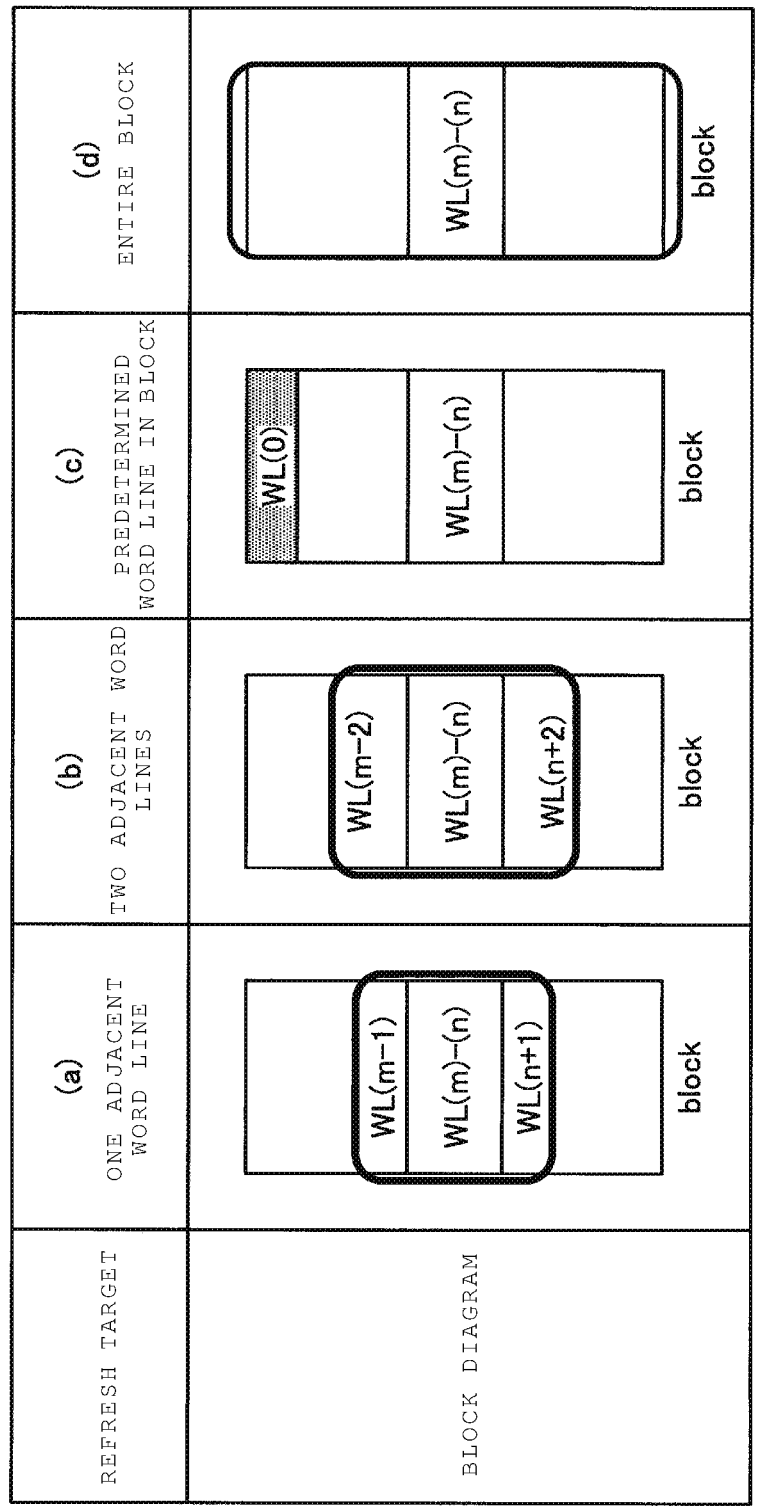
FIG. 11 is a diagram for describing a range of the refresh target in a first embodiment.

FIG. 11 is another diagram for describing a range of the refresh target. In FIG. 11, the counting group is configured in units of word lines, and a counting group in which the down counter value reaches the down counter target value is WL (m) to WL (n) (where, m<n). In this case, for example, as illustrated in column (a) of FIG. 11, the refresh target may be the range of word lines WL between WL(m−1) and WL(n+1), which includes the adjacent word lines to either side of a grouping of word lines WL(m) to WL(n).

In addition, as illustrated in column (b) of FIG. 11, the refresh target may be the range of word lines WL between WL(m−2) and WL (n+2), which includes two adjacent word lines on either side of the grouping of word lines WL(m) to WL (n).

In addition, as illustrated in column (c) of FIG. 11, the refresh target may be a word line which is particularly vulnerable to the read disturb; WL(0) as an example.

In addition, as illustrated in column (d) of FIG. 11, the refresh target may be the entire block which contains the grouping WL (m) to WL (n).

Figure 5:
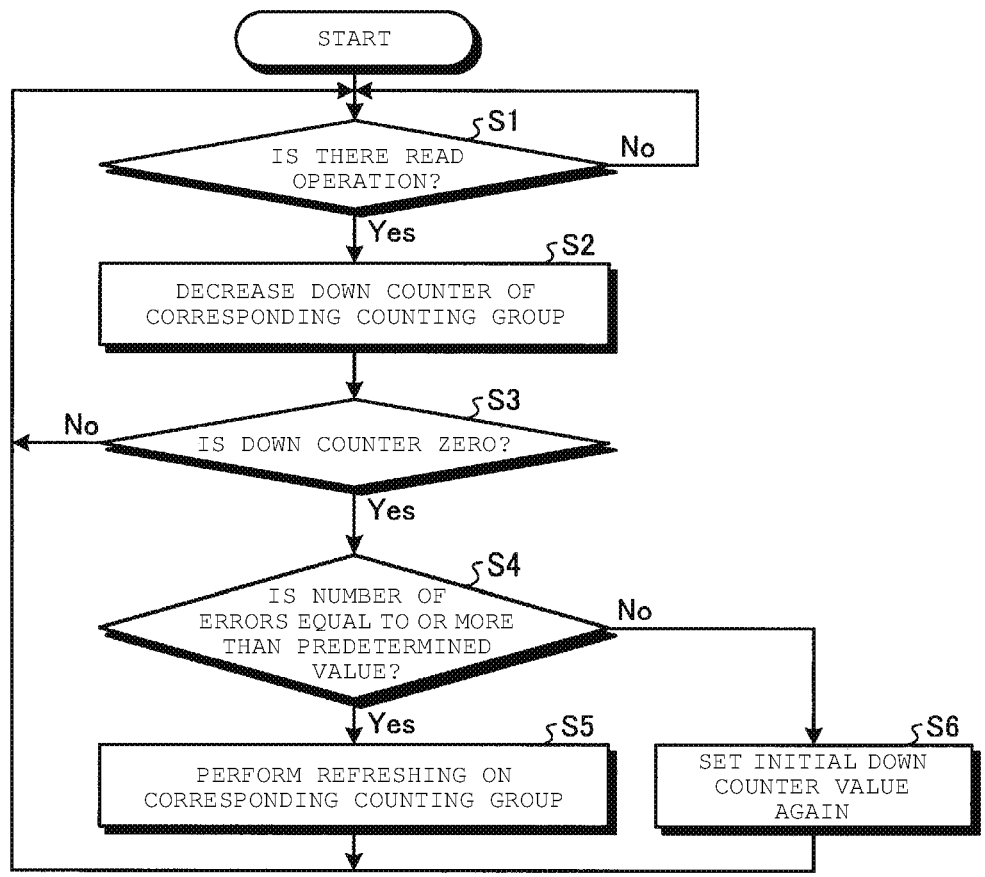
FIG. 5 is a flowchart illustrating a process for a refresh in a memory system of the first embodiment.

Next, a process in the memory system 1 of the first embodiment will be described with reference to FIG. 5. FIG. 5 is a flowchart illustrating a process such as refreshing in the memory system 1 of the first embodiment. As illustrated in FIG. 4, any number between 90,000 and 100,000 is set as the initial down counter value for each group. The initialization of the down counter may be performed when data in a block is erased as described using FIG. 12 for example.

First, the counter update circuit 222 determines whether data has been read from the NAND memory 3 by the read circuit 232 (Step S1). In a case where it is determined 'Yes', the procedure proceeds to Step S2. In a case where it is determined 'No', the procedure returns to Step S1.

In Step S2, the counter update circuit 222 decrements the down counter (stored, for example, in the DRAM 4 of FIG. 1) of a counting group where the read operation occurs.

Next, in Step S3, the target detection circuit 223 determines whether the down counter value (in the DRAM 4) reaches the down counter target value (for example, zero). In a case where it is determined 'Yes', the procedure proceeds to Step S4. In a case where it is determined 'No', the procedure returns to Step S1.

In Step S4, the NAND control circuit 23 reads data by the read circuit 232 for the counting group, and determines whether the number of errors (for example, the number of error bits in a page or the number of correction failures in the error correction) is equal to or more than a predetermined value using the ECC processing circuit 233. In a case where it is determined 'Yes', the procedure proceeds to Step S5. In a case where it is determined 'No', the procedure proceeds to Step S6.

In Step S5, the NAND control circuit 23 performs the refreshing on the counting group in which the down counter value reaches the down counter target value (for example, zero) ('Yes' in Step S3) and the number of errors is equal to or more than the predetermined value ('Yes' in Step S4). In some instances, the counter value alone may be used as a condition to determine whether the refreshing is performed and the evaluation of whether the number of errors is equal to or more than the predetermined value (Step S4) may be omitted. After Step S5, the procedure returns to Step S1.

In Step S6, the initial value setting circuit 221 of the counter control circuit 22 sets the initial down counter value again. The setting of the initial down counter value may be, for example, to 10,000 that is smaller than the previously set value. In other words, data in a counting group in which the number of errors is less than the predetermined value is considered to be still reliable even though the down counter value reaches the down counter target value. Thus, a value smaller than the previously set value may be set as the initial down counter value without performing the refreshing.

In this way, according to the memory system 1 of the first embodiment, it is possible to prevent reliability reduction caused by the read disturb. It is also possible to significantly reduce the possibility that many counting groups will closely in time reach the refresh threshold.

In addition, the process can be completed by randomly selecting the initial down counter value (that is, the threshold of the read count) for each counting group.

In addition, the read count is tracked by decrementing the down counter, and the down counter target value may be set to zero, so that the functions can be easily implemented by hardware. In particular, the reason for comparing the counter value with zero is because the configuration can be easily implemented by hardware.

In addition, when data in a counting group in which the down counter value reaches zero is read again, the down counter value may be maintained at zero. Thus, even in a case where the fact that the down counter value has reached zero is not detected immediately after the down counter value reaches zero, the fact that the down counter value has reached zero can still be detected later since the down counter value is maintained at zero.

Second Embodiment

Next, a second embodiment will be described. In the second embodiment, in addition to the contents of the first embodiment, the target detection circuit 223 determines for each counting group whether the down counter value reaches the down counter target value (for example, zero) at predetermined time intervals.

For example, in a case where the CPU in the memory controller 2 has too many tasks, the CPU might fail to notice a notification from the target detection circuit 223 immediately after it detects that the down counter value has reached zero. Hereinafter, this may be referred to as a detection failure. According to the second embodiment, the target detection circuit 223 is configured to determine for each counting group whether the down counter value has reached zero at predetermined time intervals. Thus, even in a case where a detection failure occurs, the refreshing can be performed by detecting the zero value of the counter thereafter. In other words, for example, even in a case where an interrupt queue of the memory controller 2 overflows, it is possible to surely detect the down counter(s) which reaches zero thereafter, and the refreshing can still be performed to counteract the read disturb.

Third Embodiment

Next, a third embodiment will be described. While the first embodiment has been described on an assumption that the number of memory cells in each counting group is equal, the number of memory cells for each counting group may be different in the third embodiment. For example, for those memory cell array portions which are strongly resistant to the read disturb, one group may be formed of two or three pages. As for those memory cell array portions which are weakly resistant to the read disturb, one counting group may be formed of 100 pages. Generally, the counter reaches the target value faster for the counting group formed of 100 pages, and thus the refreshing is more frequently performed. In comparison, the counter generally reaches the target value for the counting group of two or three pages later, and thus the refreshing is less frequently performed.

In this way, according to the third embodiment, the size of each counting group may be set differently according to the resistance to the read disturb in the plurality of memory cells, and the total number of counting groups can be reduced and the processing burden can be lightened without degrading effectiveness very much.

Fourth Embodiment

Next, a fourth embodiment will be described. In the first embodiment, the read count is counted by decrementing a down counter. In the fourth embodiment, the read count is counted by incrementing an up counter. Therefore, for example, a predetermined value (for example, 100,000) is first set as the target value of the up counter for the counting groups. In addition, the initial value setting circuit 221 selects any number within a predetermined initial value range (for example, between 0 and 10,000) less than the predetermined value as the initial up counter value for each counting group. Further, the initialization of the up counter may be performed when data in a block of a counting group corresponding to the up counter is erased, which is similar to the initialization of the down counter (as illustrated in FIG. 12).

Then, the counter update circuit 222 counts the read count by incrementing the up counter at every read operation in each counting group.

Further, in a case where the up counter is to be incremented, target values for each counting group may be set to a common (same) value while the initial values for each up counter are set differently. Note that setting of the initial value in common while the target values are set differently is actually equivalent in operation, and thus either process may be employed.

In this way, according to the fourth embodiment, the read count can be counted by incrementing an up counter rather than decrementing a down counter.

Fifth Embodiment

Next, a fifth embodiment will be described. In the first embodiment, the initial down counter value for each counting group is randomly selected from a predetermined initial value range. In the fifth embodiment, the initial counter value for each counting group is selected within the predetermined initial value range using a mathematical relationship or a logical expression. For example, in a case of using an up counter and not a down counter, the initial value setting circuit 221 determines the initial up counter value based on the following two conditions.

(Condition 1) The number of counting groups which have the same initial counter values is set to be equal to or less than some predetermined number.

(Condition 2) An inter-group distance between the counting groups, which have the same initial values, is set to be equal to or greater than some predetermined distance.

In this context, the inter-group distance means the number of counting groups between any two counting groups having the same initial value when all the counting groups are ordered according to a particular access method. An example of the access method includes a sequential read.

Figure 6:
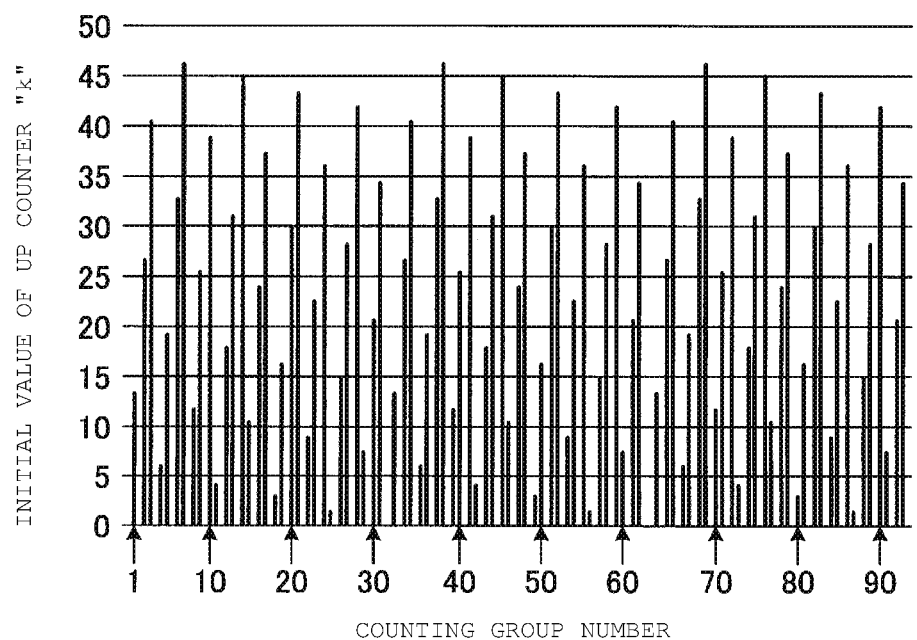
FIG. 6 is a diagram illustrating an example of an initial counter value in a fifth embodiment.

Next, an example of the initial counter value in the fifth embodiment will be described with reference to FIG. 6. FIG. 6 is a diagram illustrating an example of the initial counter values in the fifth embodiment. Herein, the inter-group distance is set to 30 or more (Condition 2) when the number of counting groups having the same initial value is 3 or less (Condition 1). A distribution of the initial counter values each corresponding to a counting group number will be as illustrated in FIG. 6, if the initial counter value is calculated using the Expression (1) below. In Expression (1) the operator "%" indicates a remainder calculation, the operator "*" indicates multiplication, and "k" indicates the adjacent value is to be multiplied by 1,000.

(Counting Group Number+(Counting Group Number %4)*8)%32*1.5k      Expression (1):

In this way, according to the fifth embodiment, it is possible to control the number of counting groups having the same initial values and to surely increase the inter-group distance, by determining the initial counter value according to the conditions, as compared to a case where the initial values are randomly determined. Thus, it is possible to reduce the performance fluctuation when the reliability reduction caused by the read disturb is detected.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the host interface control circuit 21, the initial value setting circuit 221, the counter update circuit 222, and the target detection circuit 223 which are provided in the counter control circuit 22, the write circuit 231, the read circuit 232, and the ECC processing circuit 233, which are provided in the NAND control circuit 23, may be implemented by software which is executed by one or more processors, may be implemented by hardware such as a dedicated IC (Integrated Circuit), or may be implemented by a combination of software and hardware.

What is claimed is:

1. A solid state drive, comprising:
a nonvolatile memory including a plurality of memory cells; and
a memory controller configured to control the nonvolatile memory, wherein
the plurality of memory cells is divided into a plurality of groups,
the memory controller is configured to apply a threshold read count value from a predetermined range of read count values to each group, an uppermost value of the predetermined range being a value for determining whether to perform a refreshing process, and
the memory controller includes:
a counter configured to track a read count for each group,
a determination circuit configured to compare the read count for each group tracked by the counter to the applied threshold read count value for the group,
a threshold setting circuit configured to apply the threshold read count value to each group by randomly selecting numbers within the predetermined range, and
a nonvolatile memory read/write control circuit configured to read data from the group when the determination circuit indicates that the read count for the group has reached the applied threshold read count value.

2. The solid state drive according to claim 1, wherein a lowermost value of the predetermined range is smaller than the uppermost value by ten percent.

3. The solid state drive according to claim 1, wherein the nonvolatile memory read/write control circuit is further configured to perform the refreshing process by which the data read from the group is written to the plurality of memory cells.

4. The solid state drive according to claim 1, wherein the nonvolatile memory read/write control circuit is further configured to perform the refreshing process by which the data read from the group is written to the plurality of memory cells if the data read by the read/write control circuit has more bit errors than a predetermined reference level.

5. The solid state drive according to claim 1, wherein a different threshold read count value within the predetermined range is applied to each group in the plurality of groups.

6. The solid state drive according to claim 1, wherein the determination circuit is configured to compare the read count to the applied threshold read count value for each group at predetermined time intervals.

7. The solid state drive according to claim 1, wherein the threshold setting circuit is configured to apply the threshold read count value for each group by selecting the numbers within the predetermined range such that a total number of groups in the plurality of groups having a particular threshold read count value in common is less than or equal to a predetermined number and an inter-group distance in a predetermined read sequence for the groups is greater than or equal to a predetermined distance for the groups with the particular threshold read count value in common.

8. The solid state drive according to claim 7, wherein the predetermined read sequence is a sequential read in logical address space.

9. The solid state drive according to claim 1, wherein the number of memory cells in each group is not equal.

10. A method of controlling a nonvolatile memory, the nonvolatile memory including a plurality of memory cells, the plurality of memory cells being divided into a plurality of groups, the method comprising:
applying a threshold read count value from a predetermined range of read count values to each group by randomly selecting numbers within the predetermined range;
an uppermost value of the predetermined range being a value for determining whether to perform a refreshing process;
tracking a read count for each group;
comparing the read count for each group to the applied threshold read count value for the group; and
reading data from the group when the read count for the group has reached the applied threshold read count value.

11. The method according to claim 10, wherein a lowermost value of the predetermined range is smaller than the uppermost value by ten percent.

12. The method according to claim 10, further comprising:
performing the refreshing process by which the data read from the group is written to the plurality of memory cells.

13. The method according to claim 10, further comprising:
performing the refreshing process by which the data read from the group is written to the plurality of memory cells when the data read from the group has more bit errors than a predetermined reference level.

14. The method according to claim 10, wherein a different threshold read count value within the predetermined range is applied to each group in the plurality of groups.

15. The method according to claim 10, wherein the comparing is executed at predetermined time intervals.

16. The method according to claim 10, further comprising:
applying the threshold read count value for each group by selecting the numbers within the predetermined range such that a total number of groups in the plurality of groups having a particular threshold read count value in common is less than or equal to a predetermined number and an inter-group distance in a predetermined read sequence for the groups is greater than or equal to a predetermined distance for the groups with a particular threshold read count value in common.

17. The method according to claim 16, wherein the predetermined read sequence is a sequential read in logical address space.

18. The method according to claim 10, wherein the number of memory cells in each group is not equal.

* * * * *